United States Patent
Ishikawa

(10) Patent No.: US 10,009,125 B2
(45) Date of Patent: Jun. 26, 2018

(54) MONITORING SYSTEM, MONITORING METHOD, AND STORAGE MEDIUM HAVING MONITORING PROGRAM STORED THEREIN

(71) Applicant: NEC Corporation, Minato-ku, Tokyo (JP)

(72) Inventor: Kazunori Ishikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days. days.

(21) Appl. No.: 15/534,600

(22) PCT Filed: Dec. 15, 2015

(86) PCT No.: PCT/JP2015/006249
§ 371 (c)(1),
(2) Date: Jun. 9, 2017

(87) PCT Pub. No.: WO2016/103634
PCT Pub. Date: Jun. 30, 2016

(65) Prior Publication Data
US 2017/0346577 A1     Nov. 30, 2017

(30) Foreign Application Priority Data

Dec. 25, 2014   (JP) .................. 2014-262316

(51) Int. Cl.
*H03G 3/20*      (2006.01)
*H04B 17/18*     (2015.01)
(Continued)

(52) U.S. Cl.
CPC .......... *H04B 17/18* (2015.01); *H03F 1/0222* (2013.01); *H03F 3/211* (2013.01); *H03F 3/60* (2013.01);
(Continued)

(58) Field of Classification Search
CPC ........................................... H03G 3/20
(Continued)

(56) References Cited

U.S. PATENT DOCUMENTS 9,020,027 B2 *    4/2015    Staszewski ........... H03F 3/2176
                                                              330/10
2008/0253650 A1 * 10/2008    Kuniba .................. G06T 5/008
                                                              382/167
2014/0043391 A1 *  2/2014    Satoh ........................ B41J 2/12
                                                              347/19

FOREIGN PATENT DOCUMENTS

JP    H11-064135 A      3/1999
JP    2004-363405 A    12/2004
(Continued)

OTHER PUBLICATIONS

International Search Report for PCT Application No. PCT/JP2015/006249, dated Jan. 19, 2016.
(Continued)

*Primary Examiner* — Henry Choe

(57) ABSTRACT

[Problem] To provide a monitoring system capable of monitoring, without stopping operations for a long period of time, a change of the characteristics of an apparatus to be subjected to characteristic measurement, to which high frequency signals are inputted. [Solution] A signal to be monitored and a reference signal are inputted to an input unit 11, and the input unit inputs one of the inputted signals to an apparatus 15 to be subjected to characteristic measurement. On the basis of an output signal of the apparatus 15 and the reference signal in the cases where the reference signal is inputted to the apparatus, an input/output characteristic calculation unit 12 calculates the input/output characteristics of the apparatus 15. On the basis of calculation results obtained from the input/output characteristic calculation unit 12, a correction result generating unit 13 generates a cor- (Continued)

rection result signal that indicates the results obtained by correcting an output signal of the apparatus 15 in the cases where the signal to be monitored is inputted to the apparatus. On the basis of the correction result signal generated by the correction result generating unit 13, a failure determining unit 14 determines whether the apparatus has a failure.

8 Claims, 7 Drawing Sheets

(51) Int. Cl.
*H04B 10/299* (2013.01)
*H03F 3/21* (2006.01)
*H03F 3/60* (2006.01)
*H04B 10/69* (2013.01)
*H03F 1/02* (2006.01)

(52) U.S. Cl.
CPC ......... *H04B 10/299* (2013.01); *H04B 10/695* (2013.01); *H03F 2200/102* (2013.01); *H03F 2200/39* (2013.01); *H03F 2200/432* (2013.01)

(58) Field of Classification Search
USPC .................................................. 330/136, 129
See application file for complete search history.

(56) References Cited

FOREIGN PATENT DOCUMENTS

JP    2008-109266 A    5/2008
JP    2013-251823 A    12/2013

OTHER PUBLICATIONS

English Translation of Written opinion for PCT Application No. PCT/JP2015/006249.

Japanese Office Action for JP Application No. 2016-565902 dated Apr. 17, 2018 with English Translation.

* cited by examiner

US 10,009,125 B2

MONITORING SYSTEM, MONITORING METHOD, AND STORAGE MEDIUM HAVING MONITORING PROGRAM STORED THEREIN

This application is a National Stage Entry of PCT/JP2015/006249 filed on Dec. 15, 2015, which claims priority from Japanese Patent Application 2014-262316 filed on Dec. 25, 2014, the contents of all of which are incorporated herein by reference, in their entirety.

TECHNICAL FIELD

The present invention relates to a monitoring system, a monitoring method, and a storage medium having a monitoring program stored therein for monitoring a change in characteristics of an apparatus subjected to characteristic measurement.

BACKGROUND ART

There is known an amplification detector configured to amplify a radio frequency (RF) signal, and to detect the amplified RF signal. Generally, output characteristics of an amplification detector change depending on a frequency, a temperature at a time of measurement, a lapse of time, and the like.

FIG. 7 is a block diagram illustrating a configuration example of a monitoring system configured to measure output characteristics of an amplification detector. In the example illustrated in FIG. 7, input signals Sa to Sn are input to amplification detectors 3a to 3n, respectively. Further, the amplification detectors 3a to 3n amplify and detect the input signals Sa to Sn which are input to obtain detection signals, and input the detection signals to monitoring circuits 4a to 4n, respectively. The monitoring circuits 4a to 4n input, to a control unit 9, monitoring result signals Ma to Mn indicating a monitoring result based on input detection signals.

PTL 1 describes a method for shaping waveform of a transmission output signal into a predetermined waveform, the transmission output signal being a signal generated in a signal generator, distributed by a distributor to input the distributed signals to amplifier, and amplified therein. Note that the method described in PTL 1 is conceivably used for calibration of an amplifier configured to amplify a monitoring target signal.

PTL 2 describes a device in which an analog multiplexer alternately switches a signal to be input to a monitoring circuit configured to output a voltage signal according to a measurement result of a sensor circuit between a monitoring target signal and a reference signal.

CITATION LIST

Patent Literature

[PTL1] Japanese Laid-open Patent Publication No. 2013-251823
[PTL2] Japanese Laid-open Patent Publication No. H11-64135

SUMMARY OF INVENTION

Technical Problem

In the monitoring system illustrated in FIG. 7, however, it is necessary to prepare the amplification detectors 3a to 3n and the monitoring circuits 4a to 4n individually according to the input signals Sa to Sn. Therefore, in a case where there are n input signals, it is necessary to individually prepare n amplification detectors and n monitoring circuits. This causes a problem that the cost and labor are required for installation and maintenance.

Further, in the monitoring system illustrated in FIG. 7, monitoring target signals are input as the input signals Sa to Sn during an operation of the amplification detectors 3a to 3n, and a reference signal for calibration is input during calibration of the amplification detectors 3a to 3n. Further, an operation of alternately switching the input signals Sa to Sn between a monitoring target signal and a reference signal is performed manually, for instance. This makes it difficult to perform a quick switching operation. Accordingly, in a case where a calibration operation of the amplification detectors 3a to 3n is performed, there is a problem that it is necessary to stop an operation of the amplification detectors 3a to 3n for a long period of time.

When a calibration operation of each amplifier is performed by the method described in PTL 1, it is necessary to switch a signal to be input to each amplifier from a monitoring target signal to a signal generated in a signal generator. Further, when the calibration operation is finished, it is necessary to switch a signal to be input to each amplifier from a signal generated in a signal generator to a monitoring target signal. As described above, these switching operations are performed manually. Therefore, this causes a problem that it is necessary to stop an operation of each amplifier for a long period of time when a calibration operation of each amplifier is performed by the method described in PTL 1.

Further, the device described in PTL 2 uses an analog multiplexer in switching an input signal from a sensor circuit. In the method using an analog multiplexer, however, it is not possible to appropriately switch an input signal of a high frequency such as a radio frequency signal.

In view of the above, an object of the the present invention is to provide a monitoring system, a monitoring method, and a storage medium having a monitoring program stored therein, which enable to monitor a change in characteristics of an apparatus subjected to characteristic measurement to which a high frequency signal is input, without stopping an operation of the apparatus for a long period of time.

Solution to Problem

A monitoring system, according to present invention, comprises:
an input means configured to receive a monitoring target signal and a reference signal, and to input one of the input signals into an apparatus subjected to characteristic measurement;
an input-output characteristic calculation means configured to calculate input-output characteristics of the apparatus subjected to characteristic measurement, based on an output signal from the apparatus subjected to characteristic measurement when the reference signal is input and the reference signal;
a correction result generation means configured to generate a correction result signal indicating a result of correcting an output signal from the apparatus subjected to characteristic measurement when the monitoring target signal is input, based on a calculation result by the input-output characteristic calculation means; and a failure determination means configured to determine whether or not the apparatus has a failure, based on the correction result signal generated in the correction result generation means.

A monitoring method, according to present invention, comprises:

receiving a monitoring target signal and a reference signal, and inputting one of the input signals into an apparatus subjected to characteristic measurement;

calculating input-output characteristics of the apparatus subjected to characteristic measurement, based on an output signal from the apparatus subjected to characteristic measurement when the reference signal is input and the reference signal;

generating a correction result signal indicating a result of correcting an output signal from the apparatus subjected to characteristic measurement when the monitoring target signal is input, based on a calculation result on the input-output characteristics; and generating a correction result signal capable of determining whether or not the apparatus has a failure, based on the generated correction result signal.

A storage medium, according to present invention, stores a monitoring program for causing a computer to execute:

an input process of causing input means configured to receive a monitoring target signal and a reference signal to input one of the input signals into an apparatus subjected to characteristic measurement;

an input-output characteristic calculation process of calculating input-output characteristics of the apparatus subjected to characteristic measurement, based on an output signal from the apparatus subjected to characteristic measurement when the reference signal is input and the reference signal; and a correction result generation process of generating a correction result signal capable of determining whether or not the apparatus has a failure by indicating a result of correcting an output signal from the apparatus subjected to characteristic measurement when the monitoring target signal is input, based on a calculation result in the input-output characteristic calculation process.

Advantageous Effects of Invention

According to the present invention, it is possible to monitor a change in characteristics of an apparatus subjected to characteristic measurement to which a high frequency signal is input, without stopping an operation of the apparatus for a long period of time.

DESCRIPTION OF EMBODIMENTS

First Example Embodiment

Figure 1:
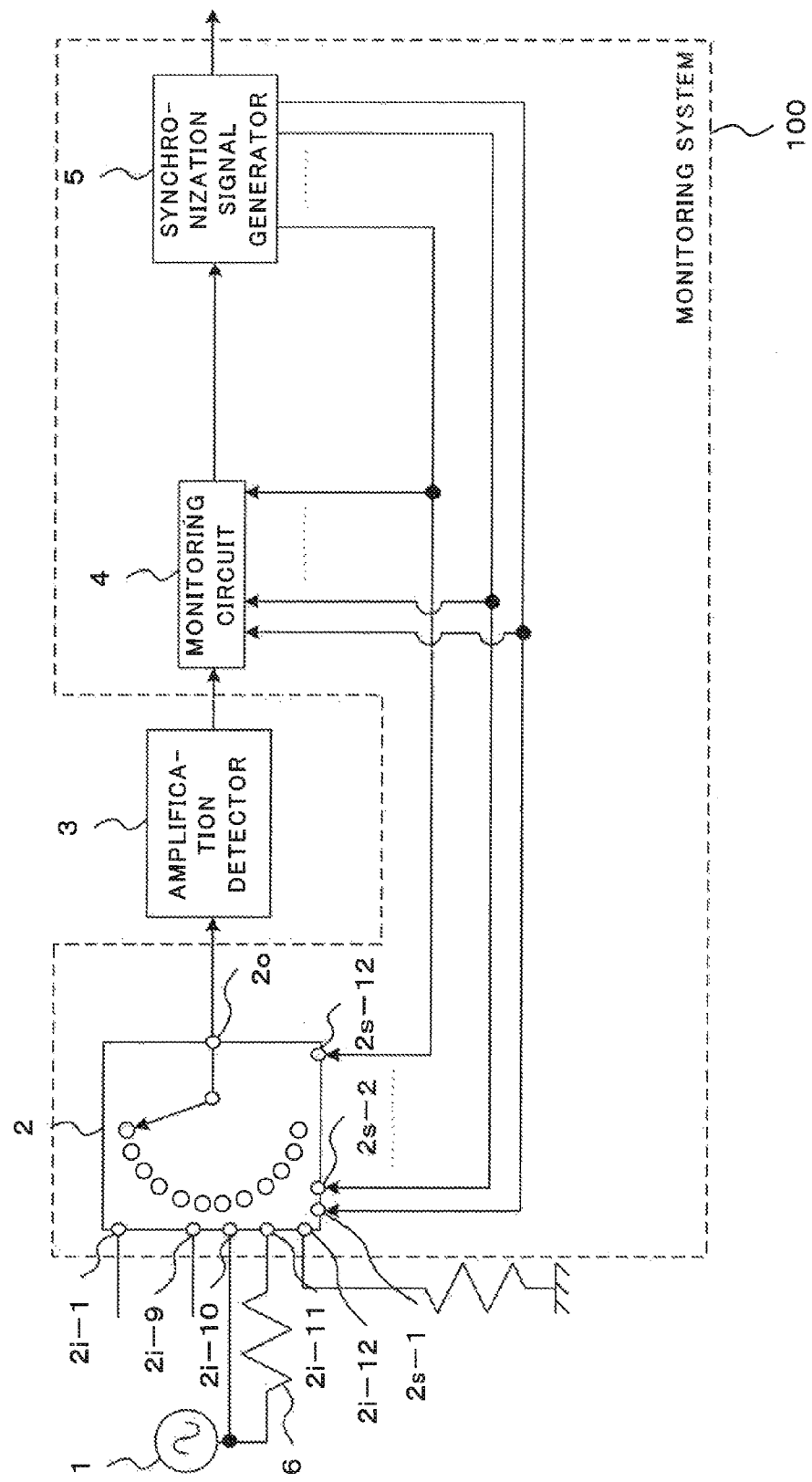
FIG. 1 is a block diagram illustrating a configuration example of a monitoring system in a first example embodiment of the present invention.

A monitoring system 100 in the first example embodiment of the present invention is described with reference to the drawings. FIG. 1 is a block diagram illustrating a configuration example of the monitoring system 100 in the first example embodiment of the present invention. As illustrated in FIG. 1, the monitoring system 100 in the first example embodiment of the present invention includes a multiplexer 2, a monitoring circuit 4, and a synchronization signal generator 5.

The multiplexer 2 is an RF switch, for instance. Further, the multiplexer 2 in this example includes twelve input terminals 2$i$-1 to 2$i$-12 for input signals, and one output terminal 2$o$. Further, monitoring target signals are input to the input terminals 2$i$-1 to 2$i$-9. Further, in this example, the input terminal 2$i$-10 is connected with a reference signal generator 1. A reference signal generated in the reference signal generator 1 is input to the input terminal 2$i$-10. The input terminal 2$i$-11 is connected with the reference signal generator 1 via an attenuator 6. A reference signal generated in the reference signal generator 1 is attenuated by the attenuator 6, and the attenuated signal is input to the input terminal 2$i$-11. In this example, the attenuator 6 attenuates a reference signal by 6 dB. Further, the input terminal 2$i$-12 is connected to a terminal of a ground level. In this example, the input terminal 2$i$-12 is connected to the terminal of a ground level via an electrical resistance.

The multiplexer 2 outputs, from the output terminal 2$o$, a signal input to one of the input terminals 2$i$-1 to 2$i$-12 according to a synchronization signal input by the synchronization signal generator 5. Then, a signal output from the output terminal 2$o$ of the multiplexer 2 is input to an amplification detector 3.

The amplification detector 3 includes an amplifier configured to amplify an input signal, and a detector configured to detect a signal amplified by the amplifier. Therefore, the amplification detector 3 generates a detection signal obtained by amplifying and detecting a signal output from the multiplexer 2, and inputs the detection signal to the monitoring circuit 4. Note that a detector inputs, to the monitoring circuit 4, a detection signal according to a result of LOG detection on a signal amplified by an amplifier.

The monitoring circuit 4 generates a monitoring result signal indicating a monitoring result, based on a detection signal input from the amplification detector 3. Note that the monitoring circuit 4 is implemented by a computer or a plurality of circuits configured to execute a process according to a program control, for instance.

The synchronization signal generator 5 generates a synchronization signal configured to synchronize a switching timing of an output signal in the multiplexer 2, and a generation timing of a monitoring result signal by the monitoring circuit 4. Then, the synchronization signal generator 5 inputs a generated synchronization signal to the multiplexer 2 and the monitoring circuit 4.

Further, the synchronization signal generator 5 determines whether or not the amplification detector 3 is properly operated, and a transmission source, a path, or the like of signals input to the input terminals 2*i*-1 to 2*i*-12 of the multiplexer 2 is properly operated, based on a monitoring result signal. Then, the synchronization signal generator 5 generates an alert signal according to the determination result.

Figure 2:
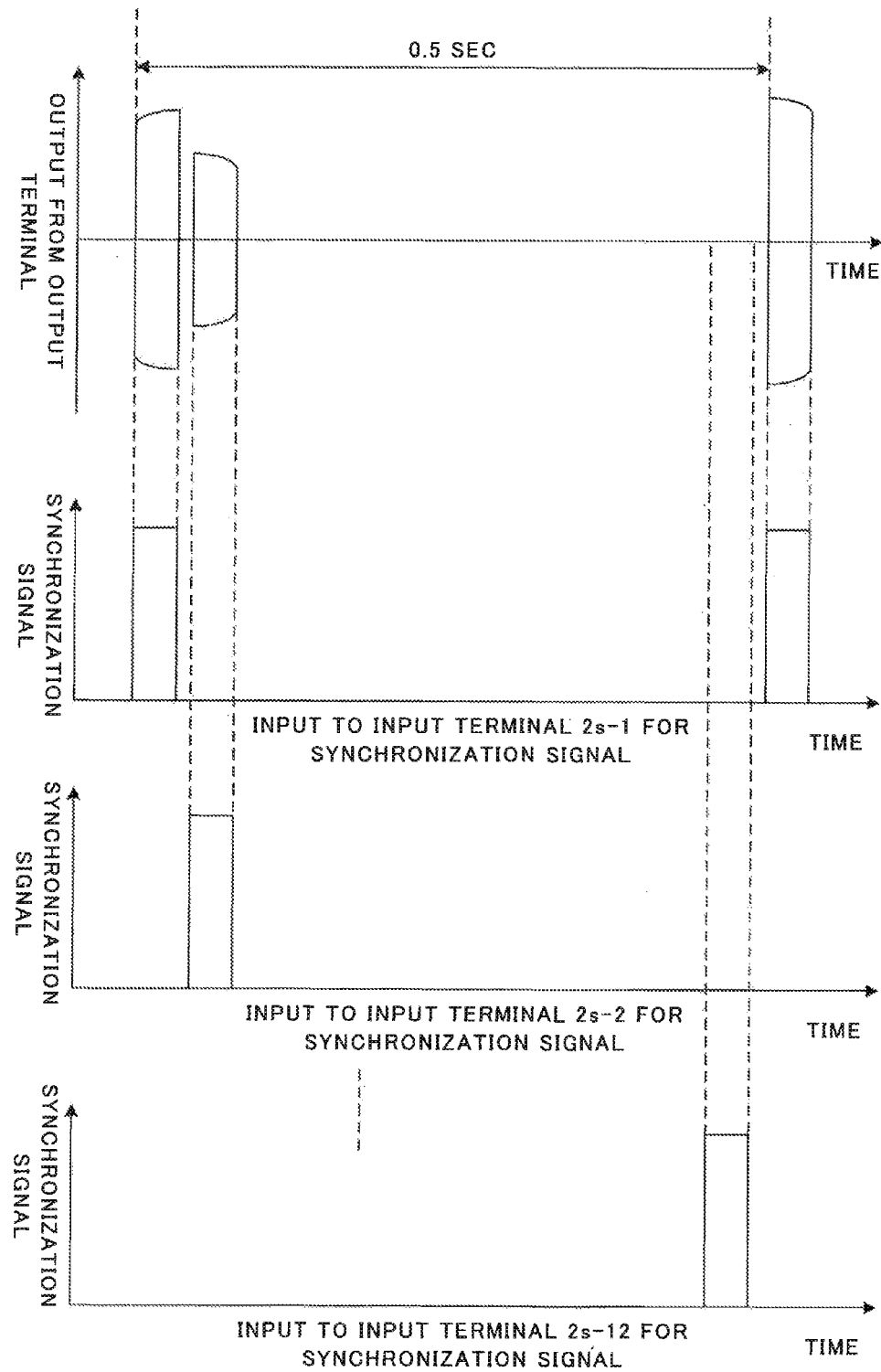
FIG. 2 is an explanatory diagram illustrating an example of a signal to be input and output in a multiplexer.

Next, a signal to be input and output in the multiplexer 2 is described. FIG. 2 is an explanatory diagram illustrating an example of a signal to be input and output in the multiplexer 2. Note that the multiplexer 2 includes input terminals 2*s*-1 to 2*s*-12 for a synchronization signal in association with the input terminals 2*i*-1 to 2*i*-12, for instance. Further, a synchronization signal is input to each of the input terminals 2*s*-1 to 2*s*-12. In the example illustrated in FIG. 2, a synchronization signal of a rectangular waveform is successively input to the input terminals 2*s*-1 to 2*s*-12. Further, as illustrated in FIG. 2, when a synchronization signal is input to the input terminals 2*s*-1 to 2*s*-12, a signal input to the associated one of the input terminals 2*i*-1 to 2*i*-12 is output from the output terminal 2*o*. Note that in this example, a signal obtained by AM (Amplitude Modulation) modulating a carrier wave in the range between 108 and 118 MHz with use of a modulation wave of 90 Hz or 150 Hz is input to the input terminals 2*i*-1 and 2*i*-2, for instance. Further, FIG. 2 illustrates these signals in the form of an envelope to simplify the description.

More specifically, for instance, an RF switch provided with a plurality of input terminals is prepared as the multiplexer 2. Further, when a synchronization signal in an ON-state is input to one of the input terminals 2*s*-1 to 2*s*-12, the output terminal 2*o* is electrically connected with one of the input terminals 2*i*-1 to 2*i*-12 associated with the one of the input terminals 2*s*-1 to 2*s*-12 to which the synchronization signal in an ON-state is input. Then, a signal input to the associated one of the input terminals 2*i*-1 to 2*i*-12 is output from the output terminal 2*o* during a time when a synchronization signal in an ON-state is input to the input terminals 2*s*-1 to 2*s*-12. Note that the input terminal 2*i*-12 is connected to a terminal of a ground level. Therefore, in a case where a synchronization signal in an ON-state is input to the associated input terminal 2*s*-12, the potential of the output terminal 2*o* is set to a ground level.

It is assumed that a synchronization signal in an ON-state is input to each of the input terminals 2*s*-1 to 2*s*-12 at a time interval of 0.5 second, for instance. Then, an input signal input to each of the input terminals 2*i*-1 to 2*i*-12 is successively and repeatedly output from the output terminal 2*o* periodically at 0.5 second as one cycle.

Figure 3:
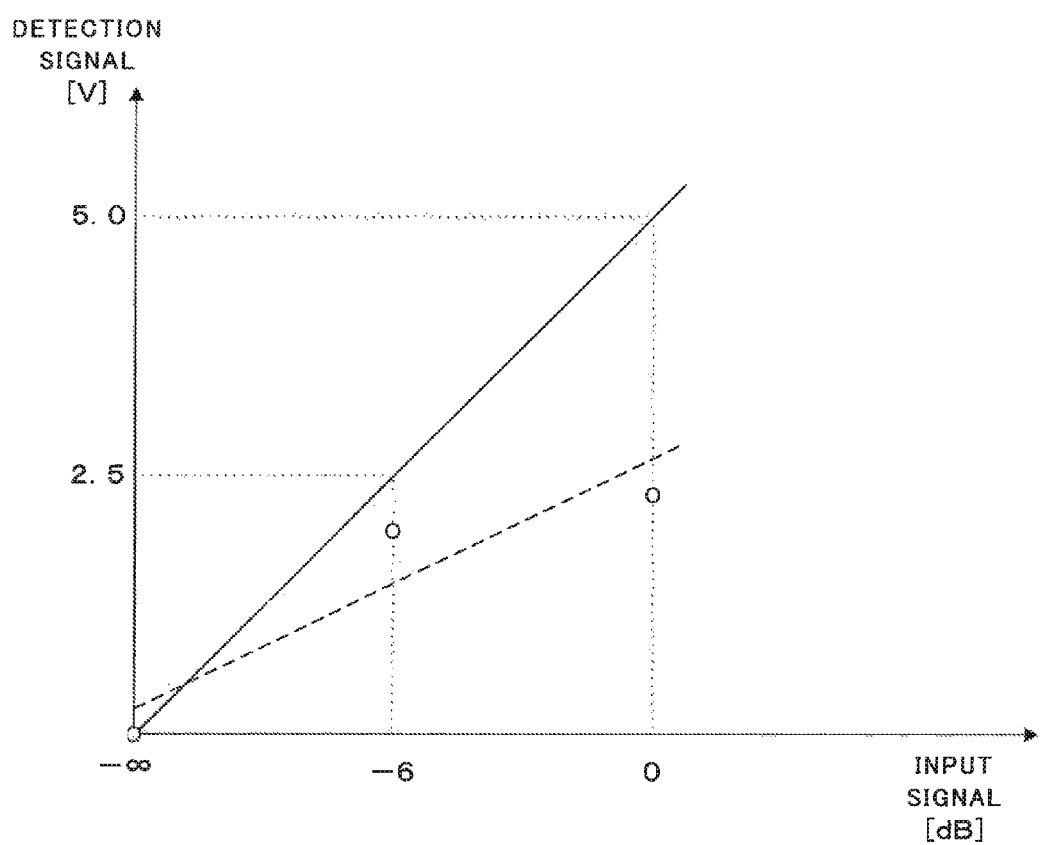
FIG. 3 is an explanatory diagram illustrating a relationship between an input signal and an output signal in an amplification detector.

FIG. 3 is an explanatory diagram illustrating a relationship between an input signal and an output signal in the amplification detector 3. The amplification detector 3 is input with: 0 dB signal input to the input terminal 2*i*-10 of the multiplexer 2; a −6 dB signal input to the input terminal 2*i*-11; and a signal according to a case where the input terminal 2*i*-12 is electrically connected to a ground terminal. These signals to be input to the input terminals 2*i*-10 to 2*i*-12 are reference signals. Monitoring target signals to be input to the input terminals 2*i*-1 to 2*i*-9 are corrected (calibrated) and output according to a calculation result to be described later, which is calculated based on reference signals.

In the amplification detector 3, the amplifier amplifies these input signals at a predetermined gain, and the detector generates detection signals obtained by detecting the signals after amplification. Therefore, an output signal is a detection signal obtained by detecting an amplified signal.

As is clear from an example indicated by a hollow circle (○) in FIG. 3, when a 0 dB signal is input to the amplification detector 3, a 2.3V detection signal is generated and input to the monitoring circuit 4. Further, as is clear from an example indicated by a hollow circle (○) in FIG. 3, when a −6 dB signal is input to the amplification detector 3, a 2.0V detection signal is generated and input to the monitoring circuit 4. In the example illustrated in FIG. 3, when a signal according to a case where the input terminal 2*i*-12 is electrically connected to a ground terminal is input to the amplification detector 3, a 0V detection signal is generated and input to the monitoring circuit 4, as illustrated by a hollow circle (○). In other words, in this example, a DC (Direct Current) offset is not generated in the amplification detector 3.

The monitoring circuit 4 derives an approximation formula in a linear function, representing a relationship between an input signal level and an output signal level in the amplification detector 3, based on a least squares method according to a synchronization signal input by the synchronization signal generator 5 and a voltage value of each input detection signal.

Specifically, the monitoring circuit 4 derives an approximation formula expressed by the following Eq. (1) according to a synchronization signal input by the synchronization signal generator 5, and a voltage value of each input detection signal:

[Eq. 1]

$$f(x) = ax + b \quad (1)$$

In the aforementioned formula,

[Eq. 2]

$$a = \frac{n\sum_{k=1}^{n} x_k y_k - \sum_{k=1}^{n} x_k \sum_{k=1}^{n} y_k}{n\sum_{k=1}^{n} x_k^2 - \left(\sum_{k=1}^{n} x_k\right)^2} \quad (2)$$

[Eq. 3]

$$b = \frac{\sum_{k=1}^{n} x_k^2 \sum_{k=1}^{n} y_k - \sum_{k=1}^{n} x_k y_k \sum_{k=1}^{n} x_k}{n\sum_{k=1}^{n} x_k^2 - \left(\sum_{k=1}^{n} x_k\right)^2} \quad (3)$$

Note that the monitoring circuit 4 can specify whether or not a signal is an output signal output from the amplification detector 3 according to a signal input to one of the input terminals 2*i*-10 to 2*i*-12 in the multiplexer 2, based on an input synchronization signal.

In this example, the monitoring circuit 4 derives an approximation formula representing a relationship between three signals input to the input terminals 2*i*-10 to 2*i*-12, and three output signals output from the amplification detector 3. Therefore, n=3 in the aforementioned Eq. (2) and Eq. (3).

Further, in this example, in the aforementioned Eq. (2) and Eq. (3), it is assumed that $x_1$ to $x_3$ are respectively 0, 0.775, and 1.55 when an input signal is −∞dB, −6 dB, and 0 dB; and $y_1$ to $y_3$ are respectively 0, 2.0, and 2.3. Then, it is clear that a=1.48, and b=0.28 (by rounding off to two decimal places).

In other words, a relationship between an input signal level and an output signal level in the amplification detector 3 in this example is expressed by an approximation formula in the following Eq. (4):

[Eq. 4]

$$y = 1.49x + 0.28 \quad (4)$$

The relationship expressed by Eq. (4) is indicated by a broken line in FIG. 3.

In this example, it is assumed that the amplification detector 3 of this example is designed to attain a relationship between an input signal level and an output signal level in which: 5/1.55=2.5/0.775=3.23 (by rounding off to two decimal places). Then, the relationship between an input signal level and an output signal level in terms of design of the amplification detector 3 in this example is expressed by the following Eq. (5):

[Eq. 5]

$$y=3.23x \quad (5)$$

The relationship expressed by Eq. (5) is indicated by a solid line in FIG. 3.

Further, the monitoring circuit 4 corrects (calibrates) an output value y of the amplification detector 3 to an output value Y with use of the following Eq. (6), based on the aforementioned Eq. (4) and Eq. (5):

[Eq. 6]

$$Y = \frac{3.23}{1.49}y - 0.28 \quad (6)$$

In this example, when 1.55, which is obtained according to an input signal of 0 dB in the amplification detector 3 of this example, is substituted into x in Eq. (4), y=2.59 (by rounding off to two decimal places). Then, when y=2.59, which is calculated as above, is substituted into Eq. (6), Y=5.34 (by rounding off to two decimal places). Thereby, a value approximated to y=5.01 in a case where 1.55 is substituted into x in Eq. (5) is calculated as an output value Y of the monitoring circuit 4.

Further, when 0.775, which is obtained according to an input signal of −6 dB in the amplification detector 3 of this example, is substituted into x in Eq. (4), y=1.43 (by rounding off to two decimal places). Then, when y=1.43, which is calculated as above, is substituted into Eq. (6), Y=2.82 (by rounding off to two decimal places). Thereby, a value, which is approximated to y=2.50 in a case where 0.775 is substituted into x in Eq. (5), is calculated as an output value Y of the monitoring circuit 4. In other words, the monitoring circuit 4 calculates an output value Y which is obtained by correcting (calibrating) an output value y of the amplification detector 3.

The monitoring circuit 4 inputs a monitoring result signal indicating the calculated output value Y to the synchronization signal generator 5. The synchronization signal generator 5 judges that which one of the input terminals 2$i$-1 to 2$i$-12 in the multiplexer 2, the output value Y is associated with, based on the output value Y indicated by the input monitoring result signal and an output timing of a synchronization signal.

Then, the synchronization signal generator 5 determines whether or not each apparatus has a failure, based on the judgment result. Specifically, a monitoring result signal whose output value Y is 5.0V or a value approximated to 5.0V is supposed to be input to the synchronization signal generator 5 at a timing at which a synchronization signal is input to the input terminal 2$s$-10 for a synchronization signal, which is associated with the input terminal 2$i$-10 to which a reference signal of 0 dB is input, for instance. However, in a case where a monitoring result signal whose output value Y is 2.0V, for instance, which is far from 5.0V, is input at the aforementioned timing, the synchronization signal generator 5 generates and outputs an alert signal alerting that a failure has occurred.

Note that a range of the output value Y corresponding to a timing at which a synchronization signal is input to the input terminals 2$s$-1 to 2$s$-12 for a synchronization signal is assumed to be set in advance in the synchronization signal generator 5, for instance. Further, in a case where a value of the output value Y indicated by the input monitoring result signal is out of the aforementioned range, an alert signal is generated and output to the synchronization signal generator 5.

According to the example embodiment, a monitoring target signal and a signal for failure determination are repeatedly input to the multiplexer 2, and the multiplexer 2 switches a signal to be input to the amplification detector 3 at a high speed. Therefore, it is possible to perform failure determination without stopping an operation with use of the monitoring target signal for a long period of time. For instance, even in a case where it is necessary to perform calibration within one second in terms of operation, in this example, calibration and monitoring are performed at 0.5 second as one cycle. Therefore, it is not necessary to stop an operation with use of the monitoring target signal for a long period of time.

Further, according to the example embodiment, even when input-output characteristics of the amplification detector 3 change from design characteristics, it is possible to update a relationship between an input signal level and an output signal level in the amplification detector 3, and to update a calculation formula on an output value Y by causing the monitoring circuit 4 to follow the change. This makes it possible to continuously perform failure monitoring with high accuracy. Note that it is possible to perform failure monitoring based on a monitoring target signal of various frequencies by changing a frequency to be generated in the reference signal generator 1 according to a frequency of the monitoring target signal.

Figure 7:
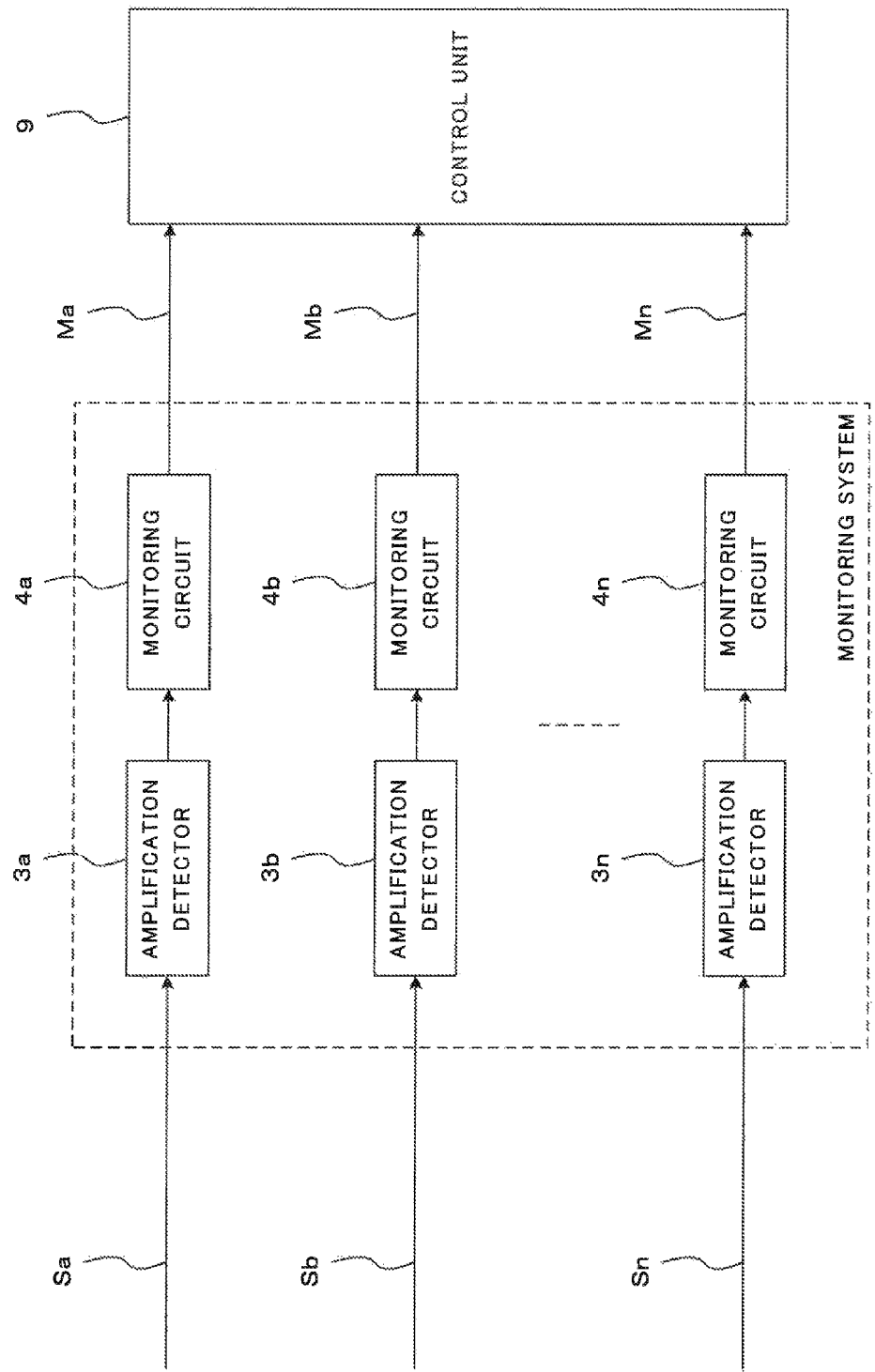
FIG. 7 is a block diagram illustrating a configuration example of a monitoring system configured to measure output characteristics of an amplification detector.

In the example illustrated in FIG. 7, amplification detectors 3$a$ to 3$n$ and monitoring circuits 4$a$ to 4$n$ are prepared for input signals Sa to Sn, respectively. On the other hand, according to the example embodiment, the multiplexer 2 is disposed on a side of a preceding stage of the amplification detector 3. Therefore, only one amplification detector 3 and only one monitoring circuit 4 are necessary. This makes it possible to reduce the cost and labor for installation and maintenance. Further, it is possible to reduce electric power consumption, the volume, and the dimensions as a whole system including the amplification detector 3. Furthermore, regarding calibration of an amplification detector, according to the example embodiment, performing calibration of the amplification detector 3 is equivalent to performing calibration with respect to each input signal. This makes it possible to reduce the calibration cost in an advantageous manner. Moreover, it is possible to reduce the number of devices constituting a system. This makes it possible to reduce a failure rate as a system in an advantageous manner.

Further, according to the example embodiment, a signal according to a case where the input terminal 2$i$-12 is electrically connected to a ground terminal is also input to the amplification detector 3. This makes it possible to easily detect a DC offset of an output signal in the amplification detector 3.

Note that the reference signal generator 1 has a function of generating a reference signal of a sufficiently high accuracy. Specifically, the reference signal generator 1 has a function of generating a reference signal, whose amount of change in the signal intensity is 0.2 dB or less in a temperature range between −10 to +55° C. and in a frequency band between 108 and 118 MHz, for instance.

Further, in an airport or a like place, for instance, a signal based on a radio wave emitted from an instrument landing system (ILS) for guiding aircrafts is input to the input terminals 2*i*-1 to 2*i*-9. Specifically, a signal received by an antenna disposed at a position far from an emission position of the radio wave (FFM: Far Field Monitor) is input to the input terminal 2*i*-1. Further, a signal received by an antenna disposed at a position near an emission position of the radio wave (NFM: Near Field Monitor) is input to the input terminal 2*i*-2. A signal to be input to an antenna for emitting the radio wave is branched and input to the input terminal 2*i*-3. According to the aforementioned configuration, it is possible to detect a failure of a monitoring antenna based on an output value Y associated with a signal input to each of the input terminals 2*i*-1 and 2*i*-2. It is also possible to speedily detect a failure of an emission source of the radio wave based on an output value Y associated with a signal input to the input terminals 2*i*-1 to 2*i*-3.

Further, when signals whose frequencies of modulation or depths of modulation are different from each other are input to the input terminals 2*i*-4 to 2*i*-9, it is possible to detect occurrence of a failure, and to grasp a location where the failure has occurred or the content of the failure based on an output value Y associated with a signal input to the input terminals 2*i*-4 to 2*i*-9.

Note that in an ILS, a sum of depth of modulation (SDM) of an emitted radio wave, or a difference in depth of modulation of radio waves whose frequencies of modulation are different from each other greatly affects the performance of a system. These parameters can be calculated based on a maximum value and a minimum value of a detection signal. Therefore, a detection signal is an important item to be monitored in terms of system performance of an ILS.

According to the example embodiment, even when input-output characteristics of the amplification detector 3 change, the monitoring circuit 4 is configured to output an output value Y after calibration according to the change. This is advantageous in accurately monitoring a detection signal output by the amplification detector 3.

Figure 4:
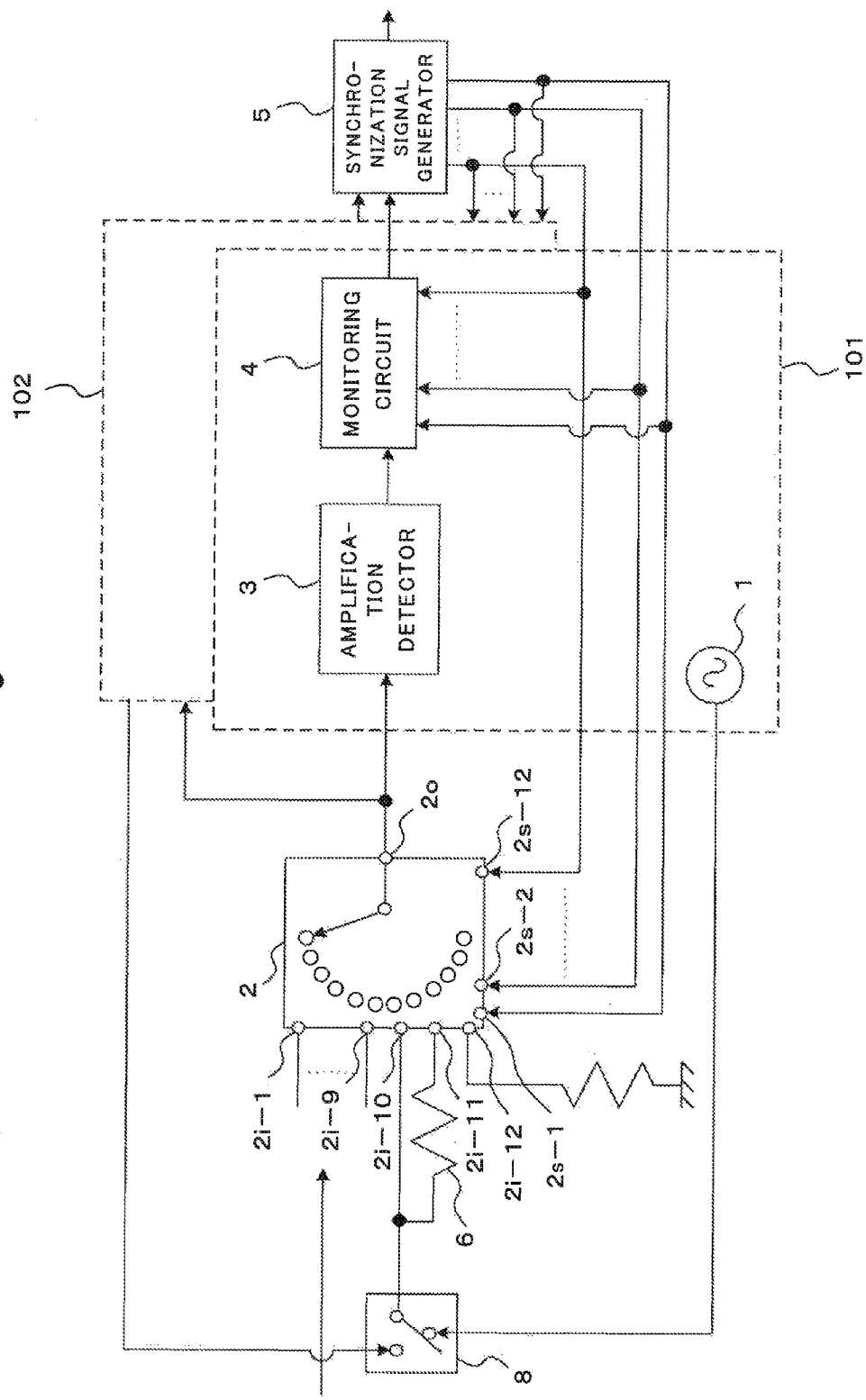
FIG. 4 is a block diagram illustrating a configuration example of a monitoring system with enhanced reliability.

The monitoring system may be configured as follows in order to enhance reliability. FIG. 4 is a block diagram illustrating a configuration example of a monitoring system with enhanced reliability. In the example illustrated in FIG. 4, two sets, each of which is constituted by a reference signal generator 1, an amplification detector 3, and a monitoring circuit 4 illustrated in FIG. 1, are connected in series to a multiplexer 2, a synchronization signal generator 5, and an attenuator 6. Further, in the example illustrated in FIG. 4, a signal generated in the reference signal generator 1 in one of the sets is input to at least one of a set 101 of an amplification detector 3 and a monitoring circuit 4, and the other set 102 of an amplification detector 3 and a monitoring circuit 4 via a branch switch 8 and a multiplexer 2.

In the example illustrated in FIG. 4, the amplification detector 3 and the monitoring circuit 4 are made redundant. This makes it possible to enhance reliability. Note that generally, a PIN (P-intrinsic-N) diode of high reliability is used for the multiplexer 2 and the two-branch switch 8. Therefore, in the example illustrated in FIG. 4, the multiplexer 2 and the two-branch switch 8 are not made redundant.

Figure 5:
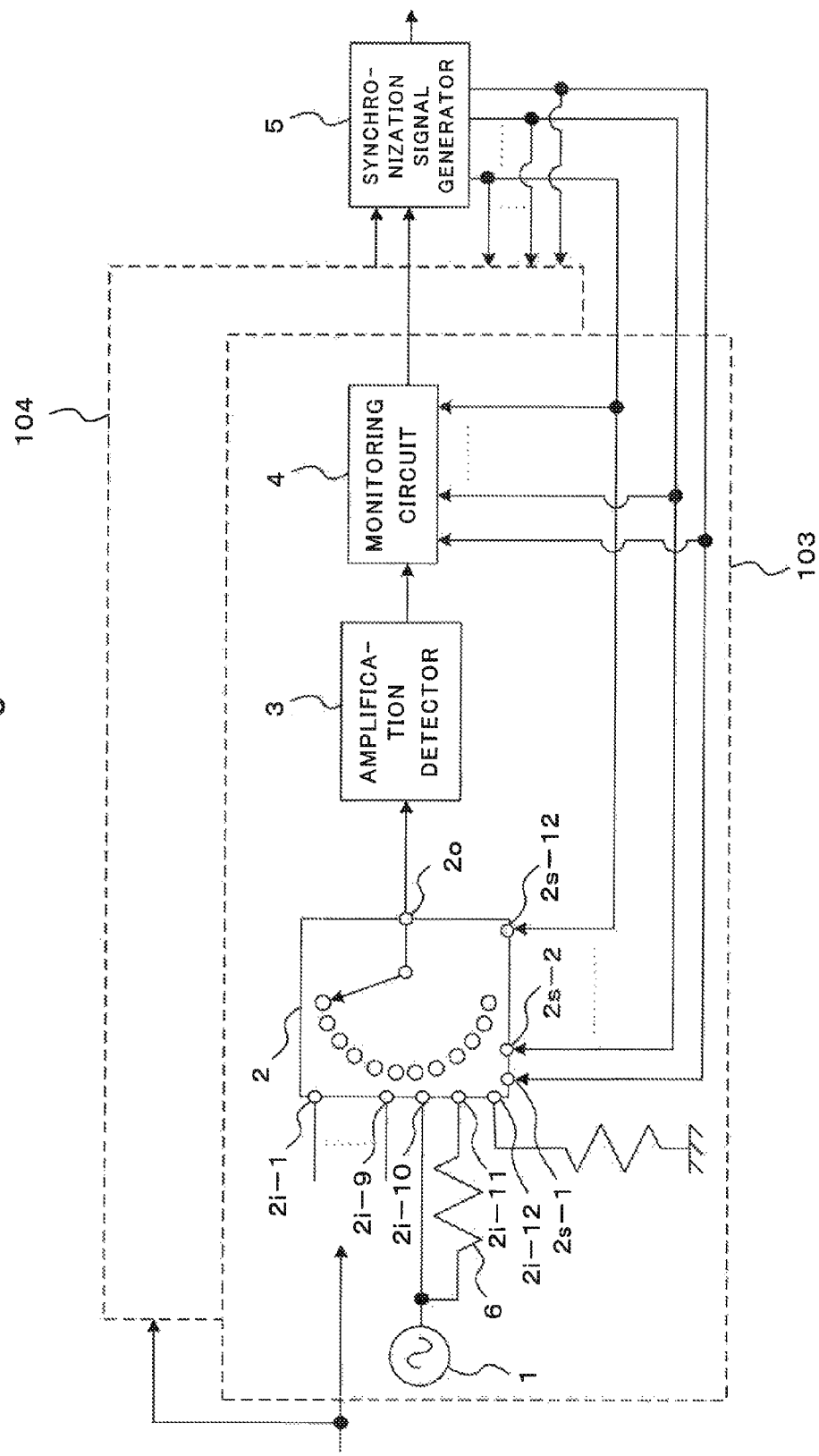
FIG. 5 is a block diagram illustrating a configuration example of a monitoring system with more enhanced reliability.

FIG. 5 is a block diagram illustrating a configuration example of a monitoring system with more enhanced reliability. In the example illustrated in FIG. 5, two sets, each of which is constituted by a reference signal generator 1, an amplification detector 3, a monitoring circuit 4, and an attenuator 6 illustrated in FIG. 1, are connected in parallel to a synchronization signal generator 5. Further, a monitoring target signal is input to each of a set 103 of a reference signal generator 1, a multiplexer 2, an amplification detector 3, a monitoring circuit 4, and an attenuator 6, and the other set 104 of a reference signal generator 1, a multiplexer 2, an amplification detector 3, a monitoring circuit 4, and an attenuator 6. Furthermore, monitoring target signals are distributed to the set 103 and the other set 104 according to distributors (not illustrated), which are prepared according to the monitoring target signals.

According to the aforementioned configuration, it is possible to further enhance reliability.

Note that in the aforementioned examples, loss of ports to which a signal generated in the reference signal generator 1 may vary in the multiplexer 2. In this case, it is possible to more accurately detect a failure by performing a process for reducing the variation, or by measuring a correction amount for use in reducing the variation to calculate an output value Y according to the measurement result.

Second Example Embodiment

Figure 6:
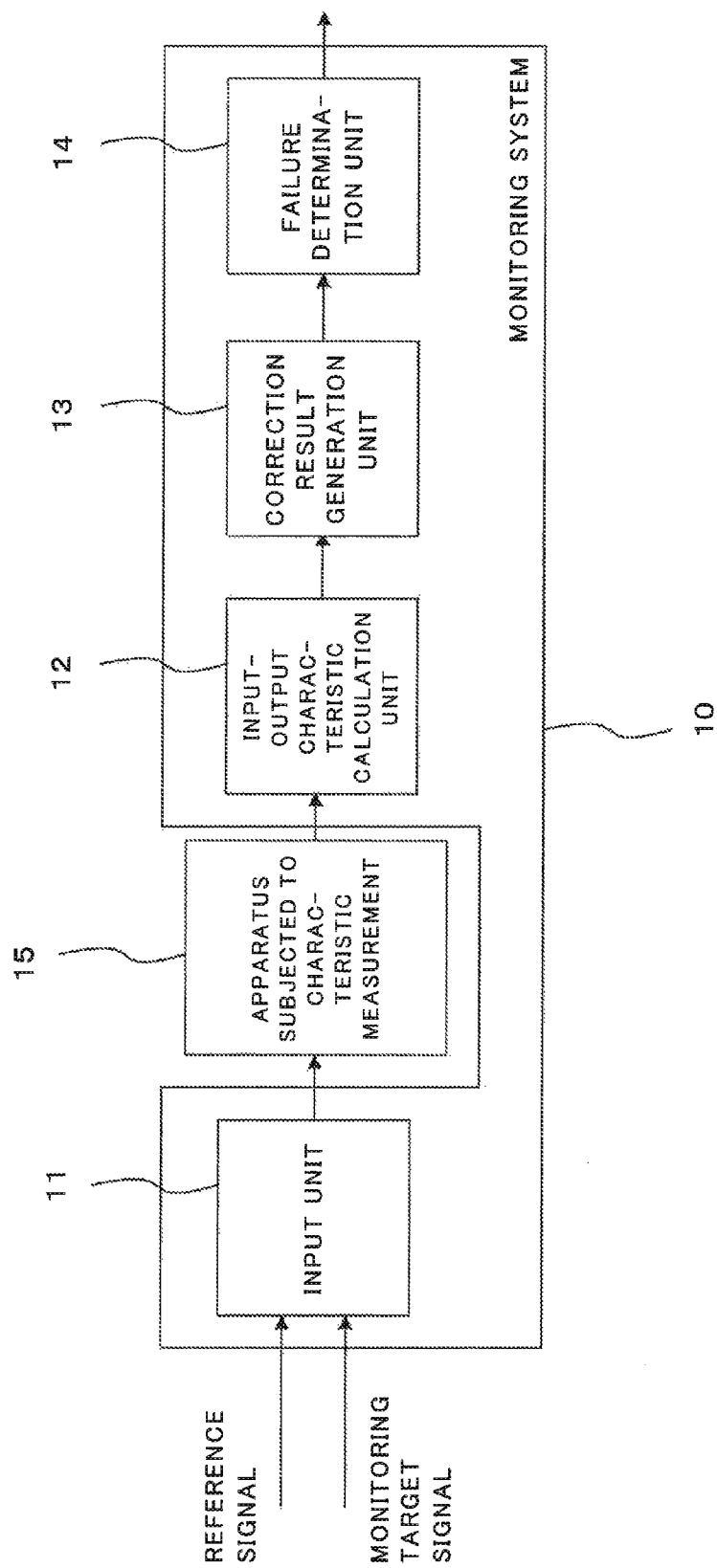
FIG. 6 is a block diagram illustrating a configuration example of a monitoring system in a second example embodiment of the present invention.

The second example embodiment of the present invention is described with reference to a drawing. FIG. 6 is a block diagram illustrating a configuration example of a monitoring system 10 in the second example embodiment of the present invention. As illustrated in FIG. 6, the monitoring system 10 in the second example embodiment of the present invention includes an input unit 11, an input-output characteristic calculation unit 12, a correction result generation unit 13, and a failure determination unit 14.

The input unit 11 corresponds to the multiplexer 2 illustrated in FIG. 1, for instance. The input-output characteristic calculation unit 12 and the correction result generation unit 13 correspond to the monitoring circuit 4 illustrated in FIG. 1, for instance. The failure determination unit 14 corresponds to the synchronization signal generator 5 illustrated in FIG. 1, for instance.

The input unit 11 is input with a monitoring target signal and a reference signal, and inputs one of the input signals to an apparatus 15 subjected to characteristic measurement. Note that the apparatus 15 subjected to characteristic measurement corresponds to the amplification detector 3 illustrated in FIG. 1, for instance.

The input-output characteristic calculation unit 12 calculates input-output characteristics of the apparatus 15 subjected to characteristic measurement, based on an output signal from the apparatus 15 subjected to characteristic measurement when a reference signal is input and the reference signal.

The correction result generation unit 13 generates a correction result signal indicating a result of correcting an output signal from the apparatus 15 subjected to characteristic measurement when a monitoring target signal is input, based on a calculation result by the input-output characteristic calculation unit 12.

The failure determination unit 14 determines whether or not the apparatus has a failure, based on a correction result signal generated by the correction result generation unit 13.

According to the example embodiment, it is possible to monitor a change in characteristics of an apparatus subjected to characteristic measurement to which a high frequency signal is input, without stopping an operation of the apparatus for a long period of time.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

Further, directions of arrows in the drawings merely indicate an example, and do not limit directions of signals between blocks.

This application is based upon and claims the benefit of priority from Japanese patent application No. 2014-262316, filed on Dec. 25, 2014, the disclosure of which is incorporated herein in its entirety by reference.

REFERENCE LIST

2 Multiplexer
2$i$-1 to 2$i$-12, 2$s$-1 to 2$s$-12 Input terminal
2$o$ Output terminal
3, 3$a$ to 3$n$ Amplification detector
4, 4$a$ to 4$n$ Monitoring circuit
5 Synchronization signal generator
6 Attenuator
8 two-branch switch
9 Control unit
10, 100 Monitoring system
11 Input unit
12 Input-output characteristic calculation unit
13 Correction result generation unit
14 Failure determination unit
15 Apparatus subjected to characteristic measurement
101, 102, 103, 104 Set
Sa to Sn Input signal

What is claimed is:

1. A monitoring system comprising:
an input unit configured to receive a monitoring target signal and a reference signal, and to input one of the input signals into an apparatus subjected to characteristic measurement;
an input-output characteristic calculation unit configured to calculate input-output characteristics of the apparatus subjected to characteristic measurement, based on an output signal from the apparatus subjected to characteristic measurement when the reference signal is input and the reference signal;
a correction result generation unit configured to generate a correction result signal indicating a result of correcting an output signal from the apparatus subjected to characteristic measurement when the monitoring target signal is input, based on a calculation result by the input-output characteristic calculation unit; and
a failure determination unit configured to determine whether or not the apparatus has a failure, based on the correction result signal generated in the correction result generation unit.

2. The monitoring system according to claim 1, wherein the input unit switches a signal to be input into the apparatus subjected to characteristic measurement at a cycle shorter than a time allowed for the monitoring system in terms of operation.

3. The monitoring system according to claim 1, wherein the reference signal includes a first reference signal, a second reference signal whose signal level is different from a signal level of the first reference signal, and a third reference signal whose signal level is different from the signal levels of the first reference signal and the second reference signal, and
the input-output characteristic calculation unit calculates input-output characteristics of the apparatus subjected to characteristic measurement, based on respective output signals from the apparatus subjected to characteristic measurement, when the first reference signal, the second reference signal, and the third reference signal are input, the first reference signal, the second reference signal, and the third reference signal.

4. The monitoring system according to claim 3, wherein a signal level of the first reference signal is 0 dB,
a signal level of the second reference signal is −6 dB, and
a signal level of the third reference signal is a ground level.

5. The monitoring system according to claim 1, wherein the failure determination unit determines that the apparatus has a failure, when a value of a correction result indicated by the correction result signal is out of a predetermined range.

6. The monitoring system according to claim 1, wherein the monitoring system includes the apparatus subjected to characteristic measurement.

7. A monitoring method comprising:
receiving a monitoring target signal and a reference signal, and inputting one of the input signals into an apparatus subjected to characteristic measurement;
calculating input-output characteristics of the apparatus subjected to characteristic measurement, based on an output signal from the apparatus subjected to characteristic measurement when the reference signal is input and the reference signal;
generating a correction result signal indicating a result of correcting an output signal from the apparatus subjected to characteristic measurement when the monitoring target signal is input, based on a calculation result on the input-output characteristics; and
generating a correction result signal capable of determining whether or not the apparatus has a failure, based on the generated correction result signal.

8. A storage medium having a monitoring program stored therein for causing a computer to execute:
an input process of causing input unit configured to receive a monitoring target signal and a reference signal to input one of the input signals into an apparatus subjected to characteristic measurement;
an input-output characteristic calculation process of calculating input-output characteristics of the apparatus subjected to characteristic measurement, based on an output signal from the apparatus subjected to characteristic measurement when the reference signal is input and the reference signal; and
a correction result generation process of generating a correction result signal capable of determining whether or not the apparatus has a failure by indicating a result of correcting an output signal from the apparatus subjected to characteristic measurement when the monitoring target signal is input, based on a calculation result in the input-output characteristic calculation process.

* * * * *